United States Patent [19]
Colquitt et al.

[11] Patent Number: 5,423,889
[45] Date of Patent: Jun. 13, 1995

[54] PROCESS FOR MANUFACTURING A MULTI-PORT ADHESIVE DISPENSING TOOL

[75] Inventors: Michael L. Colquitt, Palm Bay; Patrick T. Glynn, Indialantic, both of Fla.

[73] Assignee: Harris Corporation, Melbourne, Fla.

[21] Appl. No.: 265,355

[22] Filed: Jun. 24, 1994

[51] Int. Cl.$^6$ .......................... B05C 5/02; B05D 1/26
[52] U.S. Cl. .................... 29/25.01; 437/220; 156/295; 228/123.1; 222/1
[58] Field of Search ............... 29/25.01; 437/209, 220; 257/783; 156/295; 228/123.1; 222/1

[56] References Cited

U.S. PATENT DOCUMENTS

| | | | |
|---|---|---|---|
| 4,515,297 | 5/1985 | Schoenthaler et al. | 222/160 |
| 4,803,124 | 2/1989 | Kunz | 428/200 |
| 4,874,444 | 10/1989 | Satou et al. | 156/64 |
| 4,938,383 | 7/1990 | Yamazaki et al. | 222/41 |
| 4,989,796 | 2/1991 | Kagamihara et al. | 222/55 |
| 5,187,123 | 2/1993 | Yoshida et al. | 437/220 |

FOREIGN PATENT DOCUMENTS 1249163 10/1989 Japan.
298148 4/1990 Japan.

Primary Examiner—Olik Chaudhuri
Assistant Examiner—David E. Graybill
Attorney, Agent, or Firm—Charles Wands

[57] ABSTRACT

To generate the adhesive distribution pattern of a multi-port layout, a die attach machine is fitted with a single port adhesive dispensing head, and is cycled off-line through a sequence of step and repeat movements in accordance with a given programmed geometry control pattern, so as to sequentially generate a multi-dot adhesive pattern. After refining, as necessary, the geometry and coordinate positions of the respective adhesive dots of the desired pattern, a multi-port dispenser is formed in which the coordinates of the dispensing tubes or nozzles of the tubes of the dispensing head coincide with those of the sequential step and repeat, pick and place pattern used to cycle the single port dispensing head. The adhesive dispensing head also incorporates one or more standoffs, to ensure uniform application of adhesive at each dot location and prevent an unwanted accumulation of adhesive around the distal ends of the dispensing tube ports.

12 Claims, 3 Drawing Sheets

NEEDLE
SINGLE-NEEDLE

NEEDLES
MULTI-NEEDLE

GROOVES
STAR

GROOVES
STAMP

PROCESS FOR MANUFACTURING A MULTI-PORT ADHESIVE DISPENSING TOOL

FIELD OF THE INVENTION

The present invention relates in general to the manufacture of semiconductor devices and components, and is particularly directed to a technique for optimizing the dispensing port distribution pattern of a multi-port tool for applying die attachment adhesive to a substrate, and to the incorporation of one or more standoffs into the tool head for precisely locating the separation distance between the adhesive dispensing ports of the tool head's nozzles and the substrate upon which the adhesive is deposited.

BACKGROUND OF THE INVENTION

In the course of packaging and assembling electronic circuits and components, it is common practice to attach a circuit component, such as an integrated circuit die, to a support member, such as substrate or lead frame. Very often, the form of attachment involves the application of a prescribed quantity of a die attachment adhesive material, as diagrammatically illustrated in FIGS. 1 and 2, which shows an individual circuit die 10 attached to an underlying substrate 11 by way of a measured quantity of adhesive material 12 therebetween. The adhesive material typically takes the form of a medium to high viscosity material (often paste like), such as a polymeric, silver-filled glass, epoxy and the like, which is deposited onto the support substrate from a single port or multi-port adhesive applicator tool.

As shown in FIG. 3, such a tool customarily comprises a computer controlled step and repeat, pick and place type unit 20, having a dispensing head 22, located at the end effector position of a position arm 24, and including one or more dispensing nozzles or tubes 26 through which the adhesive material is deposited onto the substrate 11 for die attachment.

Among crucial factors in ensuring integrity of the attachment of the die to the substrate are the type, volume and pattern of the adhesive material that is dispensed onto the support substrate. An inexact volume or pattern of deposited adhesive may: 1—result in a device that fails assembly inspection, 2—fail to provide adequate electrical and/or thermal contact with the substrate, and 3—cause the device to fail mechanically in the field.

FIGS. 4–7 illustrate various adhesive dispenser tool port patterns currently used in the industry, including the single needle nozzle of FIG. 4, the multi-needle nozzle arrangement of FIG. 5, the star-grooved configuration of FIG. 6, and the stamp transfer groove pattern of FIG. 7. An evaluation of these respectively different dispensing port configurations by the present inventors has led to the conclusion that the multi-needle arrangement provides the most exact and repeatable dispense volume and pattern for the adhesive, and should be used for high reliability products, including those which must conform with standards for military applications.

Because a multi-needle adhesive applicator performs a 'single shot' delivery of adhesive from plural dispenser ports into a prescribed 'dot'-like pattern on the target substrate, the number, port diameter, placement, and finish of the needle nozzles of a multi-needle adhesive dispensing tool are critical to the tool's performance. Our analysis of currently available multi-needle tools has revealed that such tools suffer from poor fillet coverage, such as illustrated at regions 31 and 32 in FIG. 8, and the presence of an unacceptable number and size of voids, as shown at 33 in FIG. 9. (Customary practice dictates that the adhesive fillet must be present along at least 75% of the die edge, and x-ray voiding must not exceed 50% of the die area.)

SUMMARY OF THE INVENTION

In accordance with the present invention, the problems of conventional adhesive dispensing tools, particularly multi-needle configurations, described above, are effectively obviated by a new and improved design technique for optimizing the distribution pattern of the dispenser ports of a multi-needle dispensing tool, prior to its manufacture, so that, when placed into service, the tool will reliably and repetitively deposit an adhesive pattern which conforms with prescribed performance standards.

Pursuant to a first aspect of the present invention, in order to ascertain the distribution pattern of a multi-needle layout, a conventional die attach machine is fitted with a single port adhesive dispensing head, and is cycled off-line through a sequence of step and repeat, pick and place movements of the end effector in accordance with a given geometry control pattern that is programmed into the die attach machine, so as to produce a multi-dot adhesive pattern on a workpiece or support substrate.

Once the geometry and coordinate positions of the respective adhesive dots that make up the desired pattern have been finalized, a multi-port dispenser is formed in which the coordinates of the dispensing tubes or nozzles of the tubes of the dispensing head coincide with those of the sequential pick and place pattern used to cycle the single port dispensing head.

For a non-limiting example of a star-shaped dot pattern, sequential translation of a single nozzle applicator to different coordinate positions within the confines of a prescribed (generally rectangular) part perimeter may generate a dot pattern having a plurality (e.g. three) lines which cross one another. The die attachment machine is programmed to specify the locations of the coordinates of the dot pattern, and the shape and dimensions of the pattern, based upon input parameters representative of the shape and size of the perimeter of the part.

After the adhesive dot pattern has been programmed, the machine is run through a full die-attach cycle, which sequentially deposits adhesive material on a substrate at respective locations of the pattern and then attaches the die to the substrate. The die-attach fillet between the part and the support substrate may then be visually examined and/or subjected to X-ray analysis of voids, so as to determine pattern acceptability. If a modification of the pattern is required, the dot coordinates are reprogrammed and the die attach machine is again cycled through its sequential adhesive deposition and die placement sequence. Once a satisfactory adhesive deposition pattern has been realized, the resulting coordinates of the multi-dot array are employed to locate the positions of the dispensing ports of a multi-tube head to be tooled for use in an on-line manufacturing application.

According to a preferred implementation of the invention, the locations of the coordinate positions of the dots in the port pattern are calculated by means of stand-alone subroutine, executed off-line. The subroutine is initiated by the tool designer entering the dimensions of the die, the number of dots per segment of the deposition pattern, and the inset spacing of the pattern to the closest corner of the part perimeter. The coordinate locations and symmetrical spacing of the dot pattern are automatically calculated by the subroutine. The results of this subroutine are then programmed into the die attach machine. Once entered into the die attach machine, they may be followed during the step and repeat, pick and place sequence through which the single tube applicator is cycled to create the desired multi-dot adhesive pattern on the test workpiece.

In addition to having its multi-port layout optimized, the adhesive dispensing head may be augmented in accordance with a second aspect of the present invention, which involves incorporating into the head one or more standoffs, that serve to ensure uniform application of adhesive at each dot location, and prevent an unwanted accumulation of adhesive around the distal ends of the dispensing tubes. Such a build-up of adhesive might otherwise occur if the tubes were to be brought too close to the deposition surface of the support substrate upon which the adhesive material is deposited (It is also preferred that such one or more standoffs be incorporated into the single dispensing port head employed in the off-line step and repeat sequence, described above, for the same purpose.)

BRIEF DESCRIPTION OF THE DRAWINGS

FIGS. 4–7 illustrate various adhesive dispenser tool port patterns currently used in the industry, wherein FIG. 4 shows a single needle device, FIG. 5 shows a multi-needle nozzle arrangement, FIG. 6 shows a stargrooved configuration, and FIG. 7 shows a stamp transfer groove pattern;

DETAILED DESCRIPTION

As pointed out briefly above, in accordance with a first aspect of the present invention, the poor adhesive coverage problems of conventional multi-needle adhesive dispensing tools, described above, are effectively obviated by a methodology through which the adhesive deposition pattern produced by multiple dispensing ports of a multi-needle adhesive applicator tool is optimized prior to tool head manufacture, so that, when placed into service, the tool will reliably and repetitively generate an adhesive pattern which conforms with prescribed performance standards.

Pursuant to the invention, to determine the dispensing port distribution pattern of a multi-needle layout, a conventional die attach machine that has been fitted with a single port adhesive dispenser is operated off-line, to sequentially deposit a multi-dot pattern of adhesive on a test workpiece. The adhesive dot pattern is produced by a sequence of step and repeat movements of the end effector of the die attach machine in accordance with a given geometry control pattern that is programmed into the die attach machine. Once the geometry and coordinate positions of the respective adhesive dots that make up the desired pattern have been finalized, a multi-port dispenser head is formed. In this multi-port dispenser, the coordinates of the dispensing tubes or nozzles of the pattern coincide with or replicate those of the sequentially generated multi-coordinate pattern used to cycle the single port dispensing head.

Figure 1:
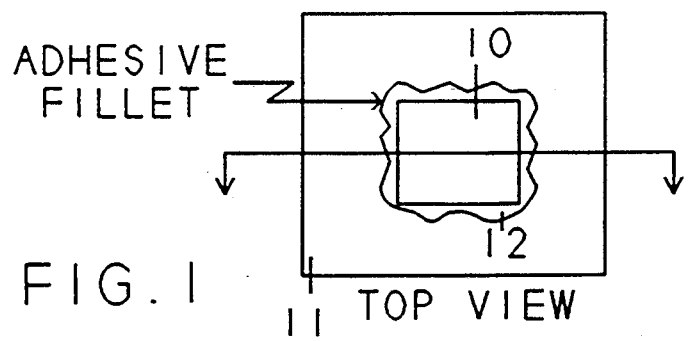
FIGS. 1 and 2 are respective top and side views of a diagrammatic illustration of adhesive attachment of a circuit die to an underlying substrate.
Figure 2:
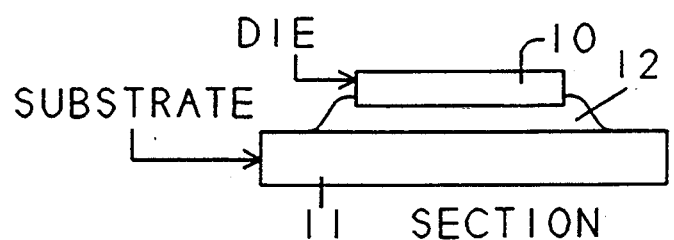
Figure 3:
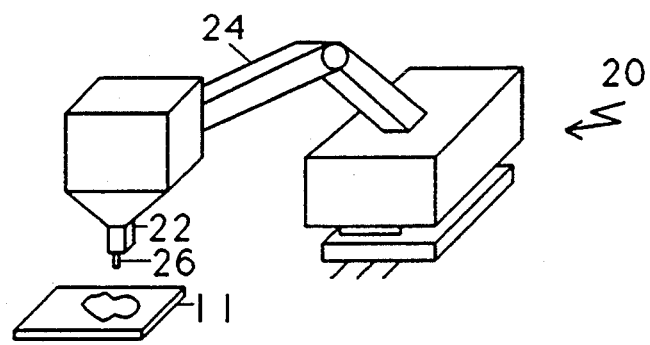
FIG. 3 diagrammatically illustrates a conventional computer-controlled step and repeat (pick and place) unit having a dispensing head located at the end effector position of a position arm, and including one or more dispensing nozzles through which adhesive material is deposited onto a substrate for die attachment.
Figure 4:
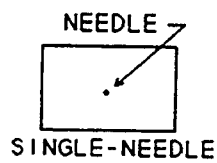
Figure 5:
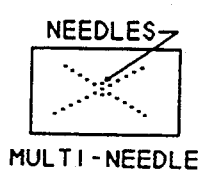
Figure 6:
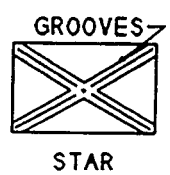
Figure 7:
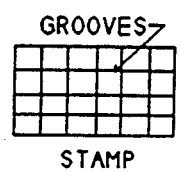
Figure 8:
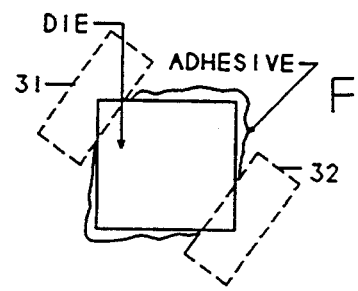
FIG. 8 shows insufficient adhesive fillet coverage resulting from the use of a conventional multi-needle adhesive applicator.
Figure 9:
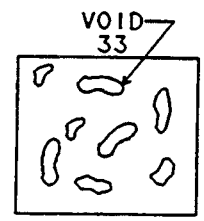
FIG. 9 shows unacceptable voids in an adhesive layer deposited by a conventional multi-needle adhesive applicator.
Figure 10:
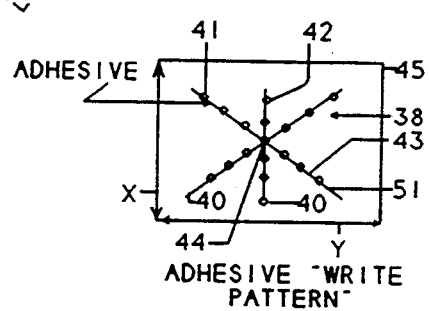
FIG. 10 diagrammatically illustrates a non-limiting example of a star-shaped sequential adhesive attachment pattern resulting from a series of step and repeat operations performed by a conventional die attach machine of the type illustrated in FIG. 3.

More particularly, FIG. 10 diagrammatically illustrates a non-limiting example of a star-shaped sequential adhesive attachment pattern 38 resulting from a series of step and repeat operations performed by a conventional die attach machine. Such a machine may be of the type diagrammatically illustrated in FIG. 3, referenced previously, for example, a "Model 6491" die-attach machine, manufactured by Kulicke and Soffa Industries Inc., in which a single adhesive dispensing tube or nozzle, located at the end effector position of a tool head positioning arm, is sequentially translated to different adhesive application positions 40. In the star shaped pattern example of FIG. 10, sequential translation of the single nozzle applicator to different coordinate positions within the confines of a generally rectangular perimeter 45 produces a star-configured pattern having three line segments 41, 42 and 43 which cross one another at an intersection point 44.

The generally rectangular perimeter 45 surrounding the pattern 38 represents the border dimensions of a part that is to be attached to a support member (workpiece). Using the programmability of the die attachment machine, the locations of the dots 40 that form the line segments of the sequentially generated pattern, and the shape and dimensions of the pattern are tailored in accordance with the shape and size of the perimeter 45 of the part, so as to obtain the required adhesive surface coverage. After the dot deposition pattern has been programmed, the machine is run through a full die attach cycle, which sequentially deposits the adhesive material at the respective locations 40 of the pattern 38 and then attaches the die.

The die attach fillet between the part and the support substrate may then be examined visually and by way of x-ray analysis to determine pattern acceptability. If a modification of the pattern is required, the adhesive deposition coordinates are reprogrammed, and the tool is once again cycled through its sequential adhesive deposition and die placement sequence. Once a satisfactory adhesive deposition pattern has been realized by means of this off-line sequential adjust and repeat process, the resulting coordinates of the multi-dot array are employed to locate the positions of the dispenser ports of a multi-tube head to be formed for use in an on-line application, as described above.

Pursuant to a preferred implementation of the invention, the locations of the coordinate positions of the dots in the array are readily calculated by means of a stand- alone subroutine, executed off-line in an auxiliary subsystem.

```
/*this proc calculates the point locations for the SPREAD option in TEACH DIE
for the 6491 Ag/glass die attach machine.
Author: Patrick Glynn*/
proc(tab);
if tableexists(tab) then del table(tab);
tab[0,1] = "x";
tab[0,2] = "y";
tab[0,3] = "x";
tab[0,4] = "y";
erase;
type '                  Multi-Dot Routine for 6491 ';
type ' ';
type ' ';
x = getnumber(' Enter the X die size value in mils :  ');
type ' ';
y = getnumber(' Enter the Y die size value in mils :   ');
type ' ';
n = getnumber(' Enter number of holes per segment (not including center) :   ');
type ' ';
c = getnumber(' Enter the inset of the corner holes in mils:   ');
type ' ';
t = getnumber(' Enter the needle O.D. in mils:   ');
type ' ';
if yesanswer (' Do you want the X and + pattern (Y or N)? ') then begin;
type ' ';
o = getnumber(' Enter the inset of the x "satellite" dots in mils :   ');
type ' ';
s = getnumber(' Enter minimum thickness between the "satellite" and standoff in
mils :   ');
type ' ';
f = getnumber(' Enter minimum thickness between the standoff and tool face in
mils :   ');
type ' ';

type '  values for point 1 : '.cfixed(x/2).','. o;
tab[1,1] = cfixed(x/2);
tab[1,2] = o;
type '  values for point 2 : '.cfixed(x/2).','.(y-o);
tab[2,1] = cfixed(x/2);
tab[2,2] = y-o;
type '  values for point 3 : '. o .','.cfixed(y/2);
tab[3,1] = o;
tab[3,2] = cfixed(y/2);
type '  values for point 4 : '.cfixed(x-o).','.cfixed(y/2);
tab[4,1] = cfixed(x-o);
tab[4,2] = cfixed(y/2);

sx = x-2*c;
sy = y-2*c;
sxn = sx/(2*n);
syn = sy/(2*n);
 do i = 0 to (2*n);
 type '  values for point '. i .'a : '. cfixed(c+(i*sxn)) .','. cfixed(c+
 (i*syn));
 tab[5+i,1] = cfixed(c+(i*sxn));
 tab[5+i,2] = cfixed(c+(i*syn));
 type '  values for point '. i .'b : '. cfixed(c+(i*sxn)) .','. cfixed(y-c-
 (i*syn));
 tab[5+i,3] = cfixed(c+(i*sxn));
 tab[5+i,4] = cfixed(y-c-(i*syn));
 end;
type ' ';
do i = 0 to n;
 wsxi = ((x/2-(c+i*sxn))**2 + (o-(c+i*syn))**2)**.5 - t;
 wsyi = ((y/2-(c+i*syn))**2 + (o-(c+i*sxn))**2)**.5 - t;
 type ' wall thickness from diagonal hole '.i.'.to satellites x/y = '.cfixed
 (wsxi).' , '.cfixed(wsyi);
 end;
```

```
wd = (sxn**2 + syn**2)**.5 - t;
type ' diagonal wall thickness = '.cfixed(wd);
type ' ';
end;
else begin;
type ' ';

sx = x-2*c;
sy = y-2*c;
sxn = sx/(2*n);
syn = sy/(2*n);
 do i = 0 to (2*n);
 type ' values for point '. i .'a : '. cfixed(c+(i*sxn)) .',' . cfixed(c+
 (i*syn));
 type ' values for point '. i .'b : '. cfixed(c+(i*sxn)) .','. cfixed(y-c-
 (i*syn));
 end;
end;
/*checking location of standoff with respect to points 1a, 1b*/;
 if o - (s+t) < c then begin;
/*type ' values for standoff 1 : '.cfixed(x/2).',' . cfixed(o-(s+t));    */
tab[lastrow(tab)+1,1] = cfixed(x/2);
tab[lastrow(tab),2] = cfixed(o-(s+t));
/*type ' values for standoff 2 : '.cfixed(x/2).','.cfixed(y-(o-(s+t)));    */
tab[lastrow(tab)+1,1] = cfixed(x/2);
tab[lastrow(tab),2] = cfixed(y-(o-(s+t)));
/*type ' values for standoff 3 : '. cfixed(o-(s+t)) .','.cfixed(y/2);    */
tab[lastrow(tab)+1,1] = cfixed(o-(s+t));
tab[lastrow(tab),2] = cfixed(y/2);
/*type ' values for standoff 4 : '.cfixed(x-(o-(s+t))).','.cfixed(y/2);    */
tab[lastrow(tab)+1,1] = cfixed(x-(o-(s+t)));
tab[lastrow(tab),2] = cfixed(y/2);

/* adjusting for the face size*/ col 1 of table(tab) = col 1 + f - cfixed(o-(s+t) - (t/2));
col 2 of table(tab) = col 2 + f - cfixed(o-(s+t) - (t/2));
col 3 of table(tab) = col 3 + f - cfixed(o-(s+t) - (t/2));
col 4 of table(tab) = col 4 + f - cfixed(o-(s+t) - (t/2));

end;
else begin;

/*type ' values for standoff 1 : '.cfixed(x/2).','. c;    */
tab[lastrow(tab)+1,1] = cfixed(x/2);
tab[lastrow(tab),2] = c;
/*type ' values for standoff 2 : '.cfixed(x/2).','.cfixed((y-c));    */
tab[lastrow(tab)+1,1] = cfixed(x/2);
tab[lastrow(tab),2] = cfixed(y-c);
/*type ' values for standoff 3 : '. c .','.cfixed(y/2);    */
tab[lastrow(tab)+1,1] = c;
tab[lastrow(tab),2] = cfixed(y/2);
/*type ' values for standoff 4 : '.cfixed(x-c).','.cfixed(y/2);*/
tab[lastrow(tab)+1,1] = cfixed(x-c);
tab[lastrow(tab),2] = cfixed(y/2);

col 1 of table(tab) = col 1 + f - (c - t/2);
col 2 of table(tab) = col 2 + f - (c - t/2);
col 3 of table(tab) = col 3 + f - (c - t/2);
col 4 of table(tab) = col 4 + f - (c - t/2);

end;
end;
```

As a non-limiting example of a suitable auxiliary subsystem in which this subroutine may be executed, a VAX-based, RS1 subsystem, running a VMS applications program, available from BBN, Boston, Mass., may be employed.

When the subroutine is run, the tool designer is asked the (rectangular-XY) dimensions of the die, shown at X and Y in FIG. 10, the number of dots per segment of the star-shaped deposition pattern, and the inset spacing of the pattern to the closest corner or the border, as shown at 51 in FIG. 10. The coordinate locations and symmetrical spacing of the dot pattern are then automatically calculated.

The results of this subroutine are then programmed into the die attach machine, so that they may be followed during the step and repeat, pick and place sequence through which the single tube applicator is cycled to create the desired multi-dot adhesive pattern on this test workpiece. Once a satisfactory adhesive deposition pattern has been realized, the resulting coordinates of the multi-dot array are mapped into positions of a multi-tube head to be formed for on-line manufacturing applications.

Figure 11:
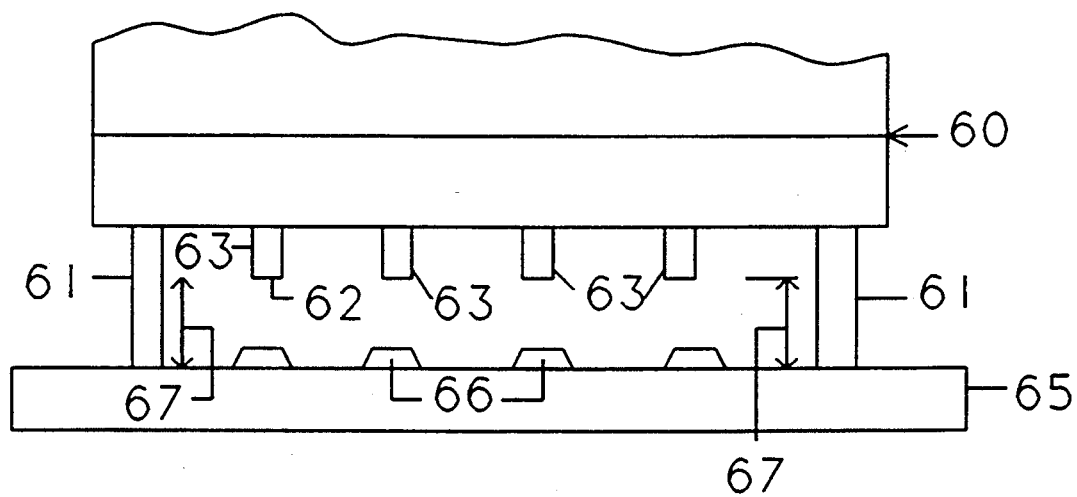
FIG. 11 diagrammatically illustrates the manner in which an adhesive dispensing head may be augmented by one or more standoffs to prevent an unwanted accumulation of adhesive around the distal ends of the adhesive dispensing tubes.

In addition to having an optimized multi-port layout, the adhesive dispensing head according to the present invention may be augmented in the manner shown in Figure 11, by incorporating into the head 60 one or more standoffs 61, which serve to ensure uniform application of adhesive at each dot location and prevent an unwanted accumulation or build-up of adhesive around the distal ends 62 of the dispensing tubes 63, which is likely to occur if the tubes were to be brought too close to the deposition surface 64 of the support substrate 65 upon which the adhesive material 66 is deposited. Moreover, it is preferred that one or more standoffs also be incorporated into the single dispensing port head employed in the off-line step and repeat sequence, described above.

More particularly, as shown in FIG. 11, the standoffs 61 extend beyond the distal ends 62 of the dispensing tubes 63, so as to provide a differential height 67 between the point at which adhesive material is dispensed from a tube 63 and the surface 64 of the support substrate 65. Based upon our analysis of typical dispensing tube diameters and adhesive materials employed in the industry, it has been found that the differential height 67 should fall within a preferred range of on the order of eight to fifteen mils, to avoid the adhesive build-up problem. The standoffs 61 should also be spaced laterally from the dispensing tubes 63 to ensure that the standoffs are not contacted by deposited adhesive. A non-limiting predetermined separation distance on the order of twenty-five mils between a standoff and closest dispensing tube has been found to be satisfactory for this purpose.

In operation, as the step and repeat operation of the die attachment machine performs successive step and repeat, pick and place operations of the adhesive dispensing head 60 (either the single tube configuration during the off-line pattern establishment sequence, or during an on-line production run with a multi-tube configuration), the dispensing head is repetitively translated from dot location to dot location and lowered toward the support substrate 65 until the standoff or standoffs 61 come into contact with the substrate. Contact of the standoffs with the substrate establishes the differential height between the distal ends 62 of the dispensing tubes 63 and the deposition surface 64 of the support substrate 65 upon which the adhesive material 66 is deposited. At each dot location, the adhesive is then dispensed onto the substrate in conformity with the nozzle pattern of the (either single or multi-tube) dispensing head. Because of the differential height 67 between the point at which adhesive is dispensed from a tube 63 and the surface 64 of the support substrate 65, there is no adhesive build-up around the distal ends of the tubes, and all adhesive dots deposited onto the substrate have a generally uniform shape and area coverage.

As will be appreciated from the foregoing description, the previously described problems of conventional semiconductor attachment multi-needle adhesive dispensing tools are effectively obviated by the dispensing port pattern optimization design technique of the present invention, which is able to ensure that, prior to its manufacture as a unitary structure, a given multi-needle dispensing head, when placed into service, will reliably and repetitively generate an adhesive pattern which conforms with prescribed performance standards. Moreover, by augmenting the adhesive dispensing head with one or more standoffs, uniform application of adhesive at each dot location is ensured, and the problem of unwanted accumulation of adhesive around the distal ends of the dispensing tubes, which might otherwise occur, if the tubes were to be brought too close to the deposition surface of the support substrate upon which the adhesive material is deposited, is avoided.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method for forming a multi-port dispenser through which plural portions of material are dispensed onto a workpiece to form a pattern of dispensed material thereon, comprising the steps of:
   (a) defining a pattern of a plurality of locations at which said material is to be applied to said workpiece;
   (b) sequentially moving a material dispensing device among the plurality of locations of the pattern defined in step (a);
   (c) at each of said plurality of locations to which said material dispensing device is sequentially moved in step (b), causing said material dispensing device to dispense a quantity of said material upon said workpiece, so as to form said pattern of dispensed material thereon;
   (d) examining said pattern of dispensed material formed upon said workpiece in step (c), so as to determine whether a characteristic thereof satisfies a criterion;
   (e) adjusting, as necessary, said locations of said pattern defined in step (a) and repeating steps (b)-(d), until step (d) has determined that said characteristic of said pattern of dispensed material formed upon said workpiece satisfies said criterion; and
   (f) forming a multi-port dispenser having a plurality of dispensing ports which, when dispensing said material onto said workpiece, form a pattern of material portions, locations of which correspond to the locations of said pattern resulting from step (e).

2. A method according to claim 1, wherein step (f) comprises forming said multi-port dispenser to include a plurality of dispensing ports which are arranged in the pattern resulting from step (e).

3. A method according to claim 2, wherein step (f) comprises forming said multi-port dispenser to further include at least one standoff, which is dimensioned to establish a separation between said workpiece and the multiple ports of said multi-port dispenser from which material is dispensed onto said workpiece, so that, when said multi-port dispenser and said workpiece are brought toward one another, said at least one standoff contacts said workpiece and thereby establishes said separation between said workpiece and the multiple ports of said multi-port dispenser from which material is dispensed onto said workpiece.

4. A method according to claim 1, wherein step (b) comprises sequentially moving a single port material dispensing device among the plurality of locations of the pattern defined in step (a), and step (c) comprises, at each of said plurality of locations to which said single port material dispensing device is sequentially moved in step (b), causing said single port material dispensing device to dispense a quantity of said material upon said workpiece.

5. A method according to claim 4, wherein said single port material dispensing device includes at least one standoff which is dimensioned to establish a separation between said workpiece and said single port from which material is dispensed onto said workpiece, and step (c) comprises, at each of said plurality of locations to which said single port material dispensing device is sequentially moved in step (b), bringing said single port material dispensing device toward said workpiece so that said at least one standoff contacts said workpiece and thereby establishes said separation between said workpiece and said single port from which material is dispensed onto said workpiece, and causing said single port material dispensing device to dispense a quantity of said material upon said workpiece.

6. A method according to claim 1, wherein said dispensed material comprises an adhesive material, and step (d) comprises placing a component upon said pattern of adhesive material formed upon said workpiece in step (c), so as to cause said component to become attached to said workpiece by said adhesive material, and examining said adhesive material upon which said component has been placed to determine fillet coverage and the extent of voids in said adhesive material.

7. A method according to claim 1, wherein step (b) comprises sequentially moving a semiconductor die attachment apparatus having a single port adhesive material dispensing head among said plurality of locations of said pattern defined in step (a), and step (c) comprises, at each of said plurality of locations to which said single port adhesive material dispensing head of said die attachment device is sequentially moved in step (b), causing said single port adhesive material dispensing head to dispense a quantity of adhesive material upon a support substrate, so as to form a pattern of dots of adhesive material thereon.

8. A method according to claim 7, wherein step (d) comprises placing a semiconductor die upon said pattern of adhesive material formed upon said support substrate in step (c), so as to cause said semiconductor die to become attached to said support substrate by said adhesive material, and examining said adhesive material upon which said semiconductor die has been placed to determine fillet coverage and the extent of voids in said adhesive material.

9. A method for forming a multi-port semiconductor die adhesive material-dispensing applicator through which plural portions of semiconductor die adhesive are dispensed in parallel onto a die attachment region of a support substrate, comprising the steps of:

(a) defining a pattern of a plurality of adhesive dot application locations where said semiconductor die adhesive material is to be applied within confines of said die attachment region of said support substrate;

(b) sequentially moving a single port adhesive material-dispensing applicator in a step and repeat manner among said plurality of adhesive dot application locations of said die attachment region of said support substrate and, at each of said plurality of locations, causing said single port adhesive material-dispensing device to dispense a quantity of said adhesive material upon said attachment region of said support substrate;

(c) placing a semiconductor die upon said adhesive material dispensed upon said attachment support substrate, so as to cause said semiconductor die become attached to said support substrate by said adhesive material;

(d) examining said adhesive material upon which said semiconductor die has been placed to determine whether adhesive coverage at said die attachment region of said support substrate is satisfactory;

(e) adjusting, as necessary, said locations of said pattern defined in step (a) and repeating steps (b)–(d), until step (d) has determined that said adhesive coverage at said die attachment region of said support substrate is satisfactory; and (f) forming a multi-port semiconductor die adhesive material-dispensing applicator having a plurality of adhesive dispensing ports which, when dispensing said adhesive material onto said die attachment region of said support substrate, form a pattern of adhesive dots, locations of which correspond to the locations of said pattern resulting from step (e).

10. A method according to claim 9, wherein step (f) comprises forming said multi-port semiconductor die adhesive material-dispensing applicator to include a plurality of adhesive material dispensing ports which are arranged in the prescribed pattern resulting from step (e).

11. A method according to claim 10, wherein step (f) comprises forming said multi-port semiconductor die adhesive material-dispensing applicator to include a plurality of adhesive material dispensing ports, which are arranged in the pattern resulting from step (e), and to further include at least one standoff, which is dimensioned to establish a separation between said support substrate and the multiple ports of said multi-port semiconductor die adhesive material-dispensing applicator from which adhesive material is dispensed onto said support substrate, so that, when said multi-port semiconductor die adhesive material-dispensing applicator is brought toward said support substrate, said at least one standoff contacts said support substrate and thereby establishes said separation between said support substrate and said multiple ports from which adhesive material is dispensed onto said support substrate.

12. A method according to claim 9, wherein said single port adhesive material-dispensing applicator includes at least one standoff which is dimensioned to establish a separation between said support substrate and said single port from which adhesive material is dispensed onto said support substrate.

* * * * *